(12) United States Patent
Yap et al.

(10) Patent No.: US 9,018,045 B2
(45) Date of Patent: Apr. 28, 2015

(54) MICROELECTRONIC PACKAGES AND METHODS FOR THE FABRICATION THEREOF

(71) Applicants: Weng Foong Yap, Phoenix, AZ (US); Douglas G. Mitchell, Tempe, AZ (US)

(72) Inventors: Weng Foong Yap, Phoenix, AZ (US); Douglas G. Mitchell, Tempe, AZ (US)

(73) Assignee: Freescale Semiconductor Inc., Austin, TX (US)

( * ) Notice: Subject to any disclaimer, the term of this patent is extended or adjusted under 35 U.S.C. 154(b) by 0 days.

(21) Appl. No.: 13/942,540

(22) Filed: Jul. 15, 2013

(65) Prior Publication Data
US 2015/0014855 A1 Jan. 15, 2015

(51) Int. Cl.
*H01L 21/00* (2006.01)
*H01L 23/48* (2006.01)
*H01L 21/56* (2006.01)

(52) U.S. Cl.
CPC ............... *H01L 23/48* (2013.01); *H01L 21/56* (2013.01)

(58) Field of Classification Search
CPC .... H01L 23/147; H01L 23/16; H01L 23/3185
USPC .............. 438/126, 125, 12; 428/126, 125, 12, 428/112, 115
See application file for complete search history.

(56) References Cited

U.S. PATENT DOCUMENTS

| | | | |
|---|---|---|---|
| 6,852,607 B2 | 2/2005 | Song et al. | |
| 8,241,954 B2 | 8/2012 | Camacho et al. | |
| 2005/0140007 A1* | 6/2005 | Jobetto | 257/738 |
| 2009/0160045 A1 | 6/2009 | Sun et al. | |
| 2011/0156240 A1 | 6/2011 | Luan et al. | |
| 2012/0211886 A1* | 8/2012 | Lieu et al. | 257/737 |

* cited by examiner

*Primary Examiner* — Caridad Everhart
(74) *Attorney, Agent, or Firm* — Ingrassia Fisher & Lorenz, P.C.

(57) ABSTRACT

Microelectronic packages and methods for fabricating microelectronic packages are provided. In one embodiment, the method comprises encapsulating a first semiconductor die having one or more core redistribution layers formed thereover in an outer molded body. The outer molded body has a portion, which circumscribes the core redistribution layer. One or more topside redistribution layers are produced over the core redistribution layer. A contact array is formed over the topside redistribution layer and electrically coupled to the first semiconductor die encapsulated in the outer molded body through the topside redistribution layers and the core redistribution layers.

20 Claims, 9 Drawing Sheets

MICROELECTRONIC PACKAGES AND METHODS FOR THE FABRICATION THEREOF

TECHNICAL FIELD

Embodiments of the present invention relate generally to microelectronic packaging and, more particularly, to microelectronic packages and methods for fabricating microelectronic packages including stepped redistribution layers.

BACKGROUND

Wafer level packaging processes can be broadly divided into two categories: Fan-In Wafer Level Packaging (FI-WLP) and Fan-Out Wafer Level Packaging (FO-WLP) processes. FI-WLP processes enable the production of Chip Scale Packages (CSP packages) containing one or more non-encapsulated die. FI-WLP processes may be performed entirely on the wafer level, while producing CSP packages having planform dimensions equal to the size of die. Electrical interconnection between the packaged die and the external contact array may be provided by a leadframe, an interposer, or a number of Redistribution Layers (RDL layers), depending upon the particular CSP approach employed. By comparison, FO-WLP processes allow the production of larger microelectronic packages having peripheral fan-out areas, which enlarge the surface area of the package topside over which the contact array is formed. In one known FO-WLP packaging approach, referred to as a "Redistributed Chip Packaging" approach, an array of singulated die is encapsulated in a molded panel over which one or more RDL layers and a Ball Grid Array (BGA) are formed. After formation of the RDL layers and the BGA, the panel is singulated to yield a number of RCP packages each containing a semiconductor die embedded within a molded body. Relative to CSP packages, RCP and other such FO-WLP packages typically provide an increased I/O pin count and superior mechanical protection of the packaged die.

BRIEF DESCRIPTION OF THE DRAWINGS

At least one example of the present invention will hereinafter be described in conjunction with the following figures, wherein like numerals denote like elements, and.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the invention are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose. Finally, as still further appearing herein, terms such as "over," "under," "on," and the like are utilized to indicate relative position between two structural elements or layers and not necessarily to denote physical contact between structural elements or layers. Thus, a first structure or layer may be described as fabricated "over" or "on" a second structure, layer, or substrate without indicating that the first structure or layer necessarily contacts the second structure, layer, or substrate due to, for example, presence of one or more intervening layers.

As appearing herein, the term "microelectronic component" is utilized in a broad sense to refer to an electronic device, element, or structure produced on a relatively small scale and amenable to packaging in the below-described manner. Microelectronic components include, but are not limited to, integrated circuits formed on semiconductor die, Microelectromechanical Systems (MEMS) devices, passive electronic components, optical devices, and other small scale electronic devices capable of providing processing, memory, sensing, radiofrequency, optical, and actuator functionalities, to list but a few examples. Microelectronic components also include other discrete or separately-fabricated structures that can be integrated into the RCP package, such as prefabricated via structures and prefabricated antenna structures. The terms "System-in-Package," "SiP," and "SiP package" are further utilized herein to refer to a microelectronic package including at least one semiconductor die packaged and electrically interconnected with at least one passive microelectronic component.

The following describes embodiments of a packaging method enabling the integration of semiconductor die having one or more RDL layers formed thereover (referred to herein as "core RDL layers") into larger RCP packages having additional RDL layers (referred to herein as "topside RDL layers") formed thereover. Thus, as do FO-WLP packages generally, the final RCP package includes an enlarged fan-out area and an increased I/O pin count. However, in contrast to conventional RCP and other FO-WLP packages, the core RDL layers are surrounded by an encapsulant to provide additional mechanical protection. As an additional benefit, the semiconductor die and the core RDL layers can be tested prior to final packaging to ensure proper function and thereby maximize product yield per fully-populated panel. The end result is a compact package that provides the advantages conventionally associated with RCP packages, but with additional structural integrity and the ability to be produced with exceptionally high product yields even when relatively complex interconnection schemes (e.g., a relatively high number of RDL layers) are required. This can be particularly advantageous in applications wherein a fully-populated RCP panel is utilized as a single or complete package; that is, the RCP panel does not undergo singulation and is instead incorporated in its entirety into a larger electronic device or system.

The core RDL layers can be produced over the semiconductor die in various different manners, including through the usage of RCP-type packaging or CSP-type packaging processes, as described in more below. Furthermore, the below-described packaging method can be utilized to produce packages containing single semiconductor die, multiple interconnected semiconductor die, or one or more semiconductor die interconnected with various different types of microelectronic components. In the latter regard, embodiments of the packaging method described herein can be utilized to produce System-in-Packages (SiP) containing at least one semiconductor die interconnected with another microelectronic component, such as a passive microelectronic device; e.g., a discrete capacitor, resistor, or inductor. When utilized to package multiple microelectronic components, embodiments of the below-described packaging method allow the disposition of one or more of the components at a level or elevation overlapping with the core RDL layers, which provides considerable flexibility in the manner in which the components are positioned and electrically interconnected within package body.

Figure 9:
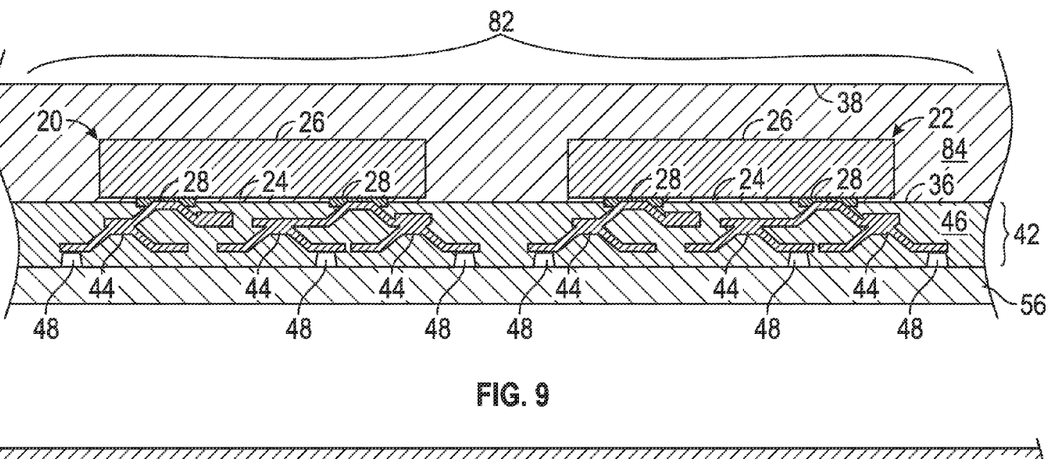
Figure 10:
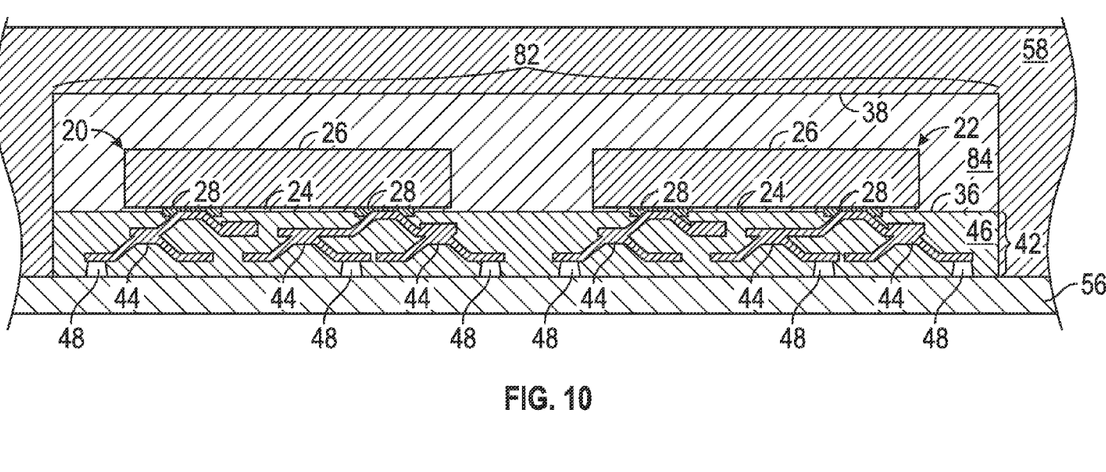
Figure 11:
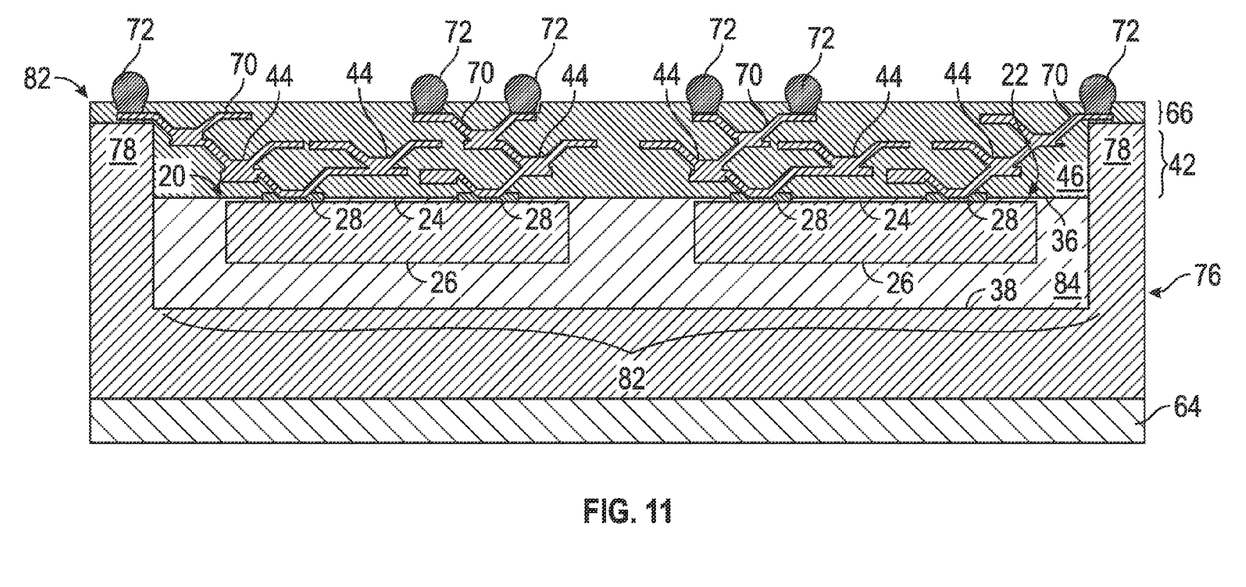

FIGS. 1-8 illustrate a single-component RCP package at various stages of completion and fabricated in accordance with a first exemplary embodiment of the present invention. FIGS. 9-11 illustrate a similar RCP package at various stages of completion, but containing multiple interconnected semiconductor die. In the exemplary embodiments shown in FIGS. 1-11, the final RCP package contains one or more semiconductor die having a number of core RDL layers initially built thereover utilizing an RCP-type packaging process, as described below in conjunction with FIGS. 1-4. In other embodiments, the packaging process can be utilized to produce RCP packages containing semiconductor die having core RDL layers produced utilizing a different type of process, such as a CSP-type packaging process of the type described below in conjunction with FIGS. 12-14. In still further embodiments, the packaging method described herein may be utilized to produce packages containing semiconductor die having core RDL layers formed thereover (whether using a RCP-type packaging process, a CSP-type packaging process, or another process) and packaged in combination with another microelectronic component, such as an additional semiconductor die lacking core RDL layer thereover or a passive microelectronic device, as described below in conjunction with FIGS. 15-18.

Figure 1:
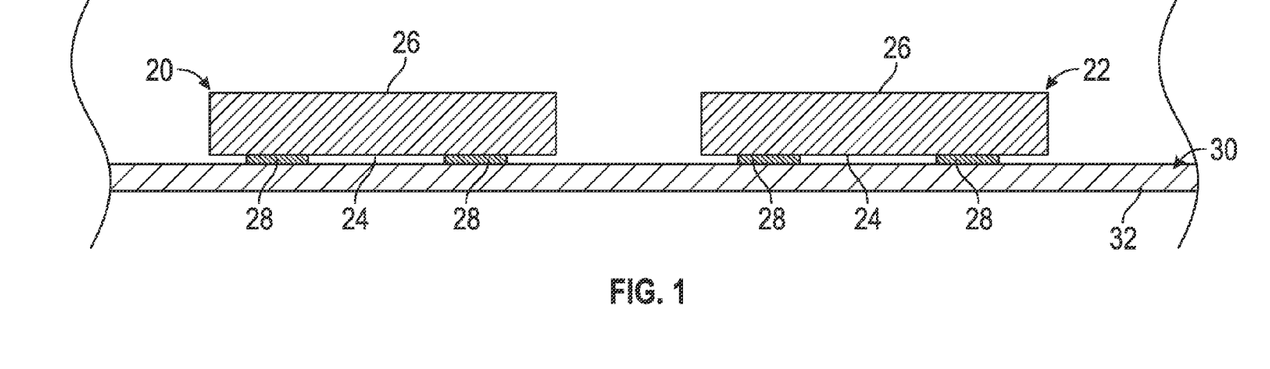
FIGS. 1-11 illustrate different manners in which semiconductor die having one or more core Redistribution Layers (RDL layers) formed thereover and initially produced utilizing a modified Redistributed Chip Packaging (RCP) process can be incorporated into a final RCP package including one or more topside RDL layers, as illustrated in accordance with a first exemplary embodiment of the present invention.

Referring initially to FIG. 1, there is shown two semiconductor die 20 and 22, which each have a topside surface 24 and an opposing backside surface 26. At this juncture in the fabrication process, semiconductor die 20 and 22 have undergone wafer-level processing to produce at least one semiconductor device (e.g., a number of transistors interconnected to form an integrated circuit) and a number of bond pads 28 on the topside 24 thereof. As indicated in FIG. 1, semiconductor die 20 and 22 have been inverted and placed facedown on temporary substrate 30 using, for example, a pick-and-place tool such that the bond pads 28 of each die 20 and 22 contact the upper surface of substrate 30. Only a relatively small portion of temporary substrate 30 supporting semiconductor die 20 and 22 is shown in FIG. 1 to avoid unnecessarily obscuring the drawings; temporary substrate 30 will typically be considerably larger than the illustrated portion, and a relatively large number of semiconductor die may be distributed over the upper surface of substrate 30 in a grid array or other spatial arrangement along with the illustrated die 20 and 22.

Temporary substrate 30 can be any body, structure, or platform suitable for supporting die 20, die 22, and the other non-illustrated semiconductor die during RCP encapsulation (also commonly referred to as "panelization" or "overmolding"). In one embodiment, temporary substrate 30 is a taped molded frame, which includes a soft tape adhesive layer 32 on which die 20 and 22 are placed. A non-illustrated mold frame, which has a central cavity or opening therein, is positioned over tape layer 32 and around the semiconductor die disposed thereon. An electrically-insulative encapsulant or mold compound, such as a silica-filled epoxy, is dispensed into the cavity of the mold frame. The encapsulant flows over and around semiconductor die 20 and 22 and the other die placed on tape layer 32. Sufficient volume of the encapsulant is typically dispensed over the die to enable the encapsulant to flow over the backside or non-contact-bearing surfaces of the semiconductor. The encapsulant may then solidified by thermal curing (e.g., heating in a partially-evacuated chamber) to yield a solid RCP panel in which semiconductor die 20 and 22 are embedded. The RCP panel is conveniently produced as a relatively thin, disc-shaped body or mass having a generally circular planform geometry; however, the panel body can be fabricated to have any desired shape and dimensions. In other embodiments, the RCP panel can be produced utilizing various other known fabrication techniques including, for example, compression molding and lamination processes.

Figure 2:
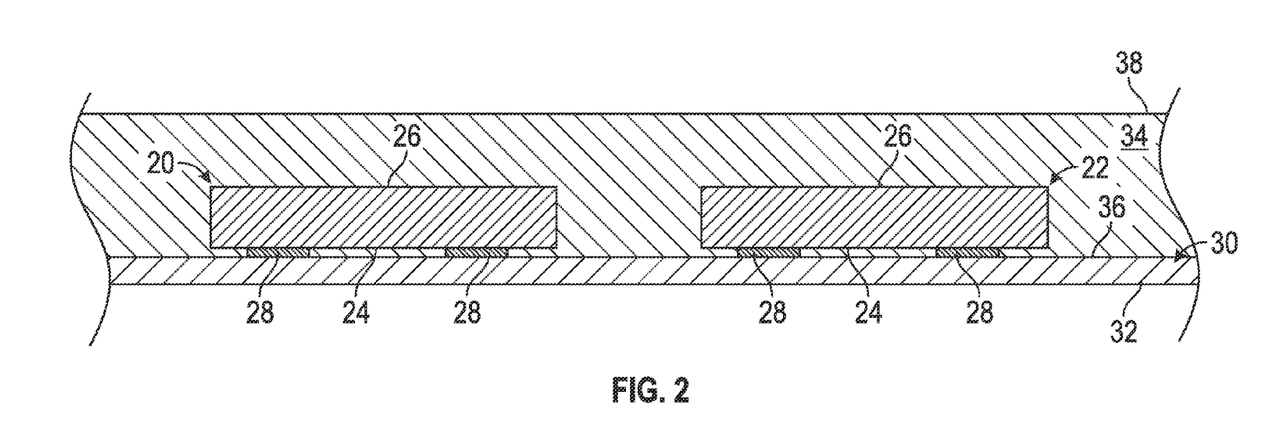
Figure 3:
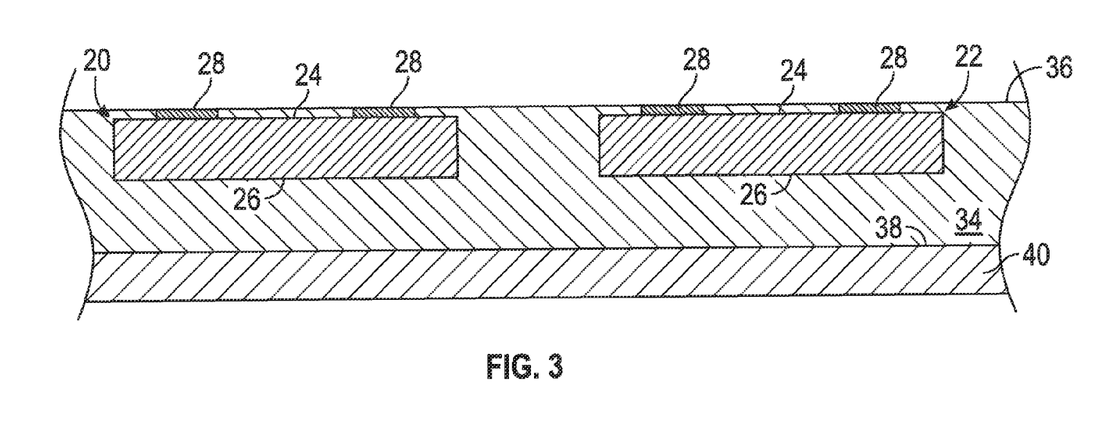

FIG. 2 illustrates a portion of an exemplary molded RCP panel 34, which may be produced pursuant to above-described encapsulation process. Again, only a small portion of molded RCP panel 34 containing semiconductor die 20 and 22 is shown in FIG. 2 for clarity with the understanding that the non-illustrated portion of RCP panel 34 may contain a relatively large number of additional semiconductor die. After encapsulation, the backside 38 of RCP panel 34 may be ground or polished to bring panel 34 to a desired thickness, which is typically in the range of about 100 to about 2000 microns (μm); although panel 34 may be thicker or thinner in further embodiments. Also, if not yet fully cured, RCP panel 34 may undergo further thermal curing, such as a final oven bake, prior to release from temporary substrate 30. Afterwards, RCP panel 34 may be released from temporary substrate 30 to reveal topside surface 36 of the panel body through which bond pads 28 of semiconductor die 20 and 22 are exposed. If desired, one more cleaning steps may be performed after panel release to remove any adhesive residue remaining on topside surface 36 of RCP panel 34. Finally, as indicated in FIG. 3, the molded RCP panel 34 may be inverted and attached to a ceramic carrier 40 for the subsequent build-up of one or more core RDL layers, as described below. In further embodiments, a ground plane may also be formed and encapsulated in the molded RCP panel.

Figure 4:
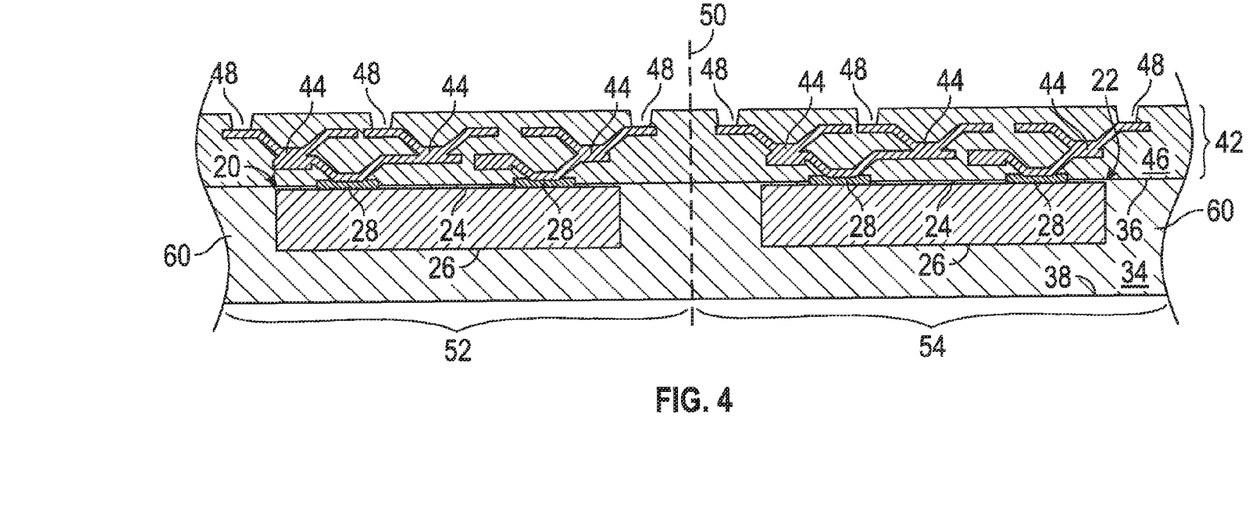

Turning to FIG. 4, one or more core RDL layers 42 (also commonly referred to as "build-up layers" or "metal levels") are now formed over topside surface 36 of RCP panel 34. Again, it will be noted that only a relatively small portion of RDL layers 42 is shown in FIG. 4 and that RDL layers 42 will typically be formed over the entire topside surface 36 of RCP panel 34 and in ohmic contact with all semiconductor die embedded within panel 34. Core RDL layers 42 may comprise a number of electrically-conductive interconnect lines 44 formed in a dielectric body 46. Interconnect lines 44 may include various metal traces, vias, metal plugs, and/or the like, which collectively provide electrically-conductive paths between the upper surface of RDL layers 42 and the underlying bond pads 28 of die 20 and 22 embedded within RCP panel 34. Dielectric body 46 may be formed as a number of successively-deposited (e.g., spun-on) dielectric layers, and interconnect lines 44 may be formed within dielectric body 46 utilizing well-known lithographical patterning and conductive-material deposition techniques, such as a metal damascene process. As indicated in FIG. 4, lithographical patterning may also be utilized to form trenches or openings 48 in the uppermost portion of body 46 to expose interconnect lines 44 therethrough for subsequent interconnection with the conductors contained within the below-described topside RDL layers; however, in other embodiments, openings 48 may be formed subsequent to the final RCP encapsulation process described below in conjunction with FIG. 6.

As indicated in FIG. 4 by dashed line 50, singulation may now be performed to separate RCP panel 34 into multiple, partially-fabricated RCP packages each containing at least one semiconductor die. The RCP packages are partially-fabricated or incomplete in the sense they lack a final capping or passivation layer on which a BGA or other external contact array is formed. With respect to the portion of panel 34 shown in FIG. 4, singulation may result in the formation of a first partially-fabricated RCP package 52 containing encapsulated die 20 and a second partially-fabricated RCP package 54 containing encapsulated die 22. As partially-fabricated packages 52 and 54 will be incorporated into a larger RCP package, packages 52 and 54 are referred to hereafter as "core RCP packages" for ease of reference. Singulation of RCP panel 34 also separates RCP panel 34 into a number of smaller molded bodies or portions 60, each of which contain at least one embedded semiconductor die. Thus, with reference to FIG. 4, the illustrated portion of RCP panel 34 is separated into first and second molded bodies 60 containing semiconductor die 20 and 22, respectively. Singulation of RCP panel 34 may be carried-out utilizing a dicing process, such as mechanical sawing. Core RCP packages 52 and 54, and the other core packages produced pursuant to singulation of RCP panel 34, may be tested immediately prior to or subsequent to singulation; and only known-good packages may be used moving forward with latter stages of the below-described packaging process.

Figure 5:
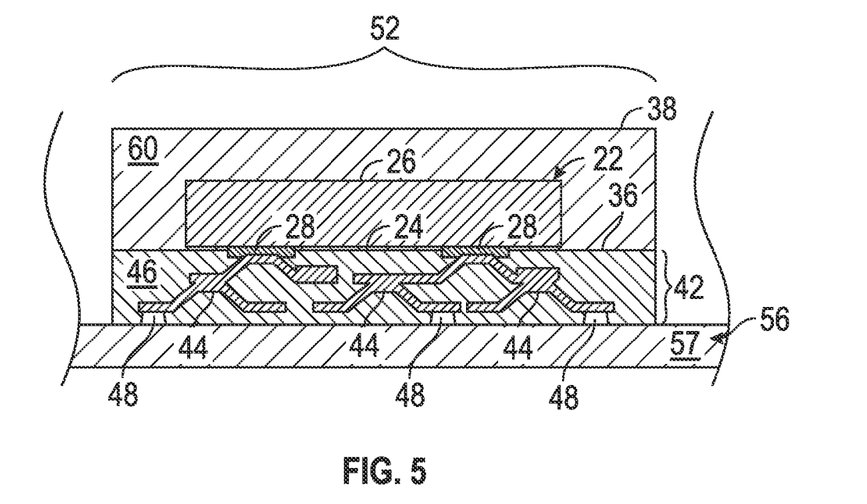

Referring next to FIG. 5, the known-good core packages are now placed in an array on a second temporary substrate 56. Although only a portion of temporary substrate 56 and only a single core RCP package (i.e., package 52) is shown in FIG. 5 for clarity, it should be understood that any practical number of additional core packages, including core RCP package 54 (FIGS. 1-4), may also be spatially distributed over the non-illustrated area of temporary substrate 56. As was the case previously, temporary substrate 56 may be a taped mold frame including a sheet or layer of adhesive tape 57 onto which core package 52 and the other non-illustrated core packages are positioned. Core package 52 is placed facedown on temporary substrate 56 such that the upper principal surface of core RDL layers 42 seats on the upper surface of tape layer 57. A solvent may be sprayed onto the tape layer after placement of the core packages to swell the adhesive, enhance the seal formed around the perimeter of the core packages, and deter the undesired inflow of the encapsulant between RDL layers 42 and substrate 56 during the below-described encapsulation process. This may be especially useful if, as shown in FIG. 5, conductor-exposing openings 48 have already been formed in core RDL layers 42.

Figure 6:
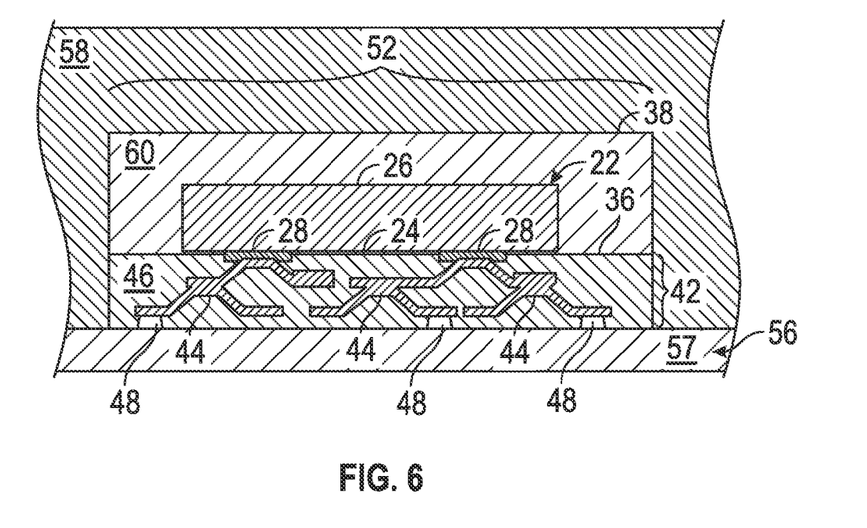

A final encapsulation or overmolding process is now performed during which core RCP package 52 and the other core packages positioned on substrate 56 are encased or embedded within a molded panel. The final encapsulation process may be carried-out in essentially the same manner as previously described; that is, a mold compound may be dispensed over core RCP package 52 and the other packages placed onto to temporary substrate 56 and then cured to produce a molded RCP panel. The resultant structure is shown in FIG. 6 wherein the molded RCP panel is identified by reference numeral "58" and only partially shown. RCP panel 58 may be created utilizing the same mold compound utilized to produce RCP panel 34 (FIGS. 2-4) or a different mold compound. The RCP panel 58 may then be ground to a desired thickness, subjected to additional heat treatment, released from substrate 56, and cleaned, as needed. In many respects, the resulting RCP panel 58 will be similar to RCP panel 34 described above in conjunction with FIGS. 2-4, although the planform dimensions and thickness of RCP panel 58 may differ as compared RCP panel 34. In one embodiment, RCP panel 58 is formed to have a final thickness between about 100 and about 3000 μm; although RCP panel 58 can be thicker or thinner than the aforementioned range in further embodiments. Also, in contrast to RCP panel 34 (FIGS. 2-4), the body of RCP panel 58 surrounds or envelopes core RCP package 52 and core RDL layers 42 to provide additional protection thereof, as further discussed below. Such a final encapsulation step also imparts the package with an enlarged topside surface 62 over which a relatively large contact array may be produced, as further described below.

Figure 7:
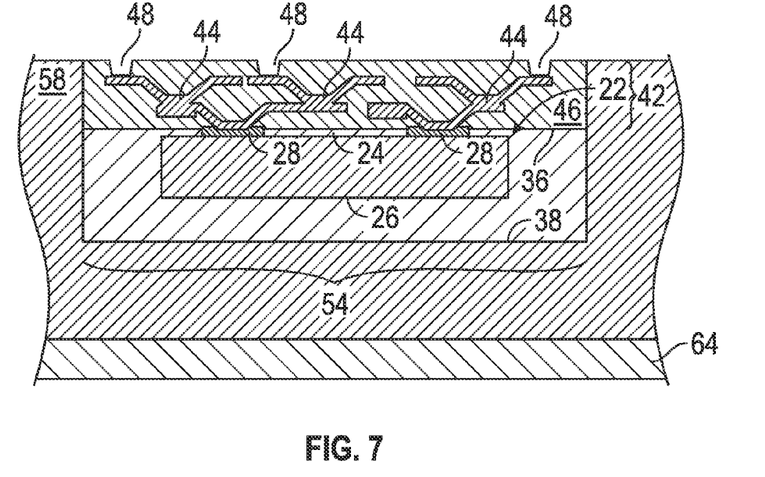
Figure 8:
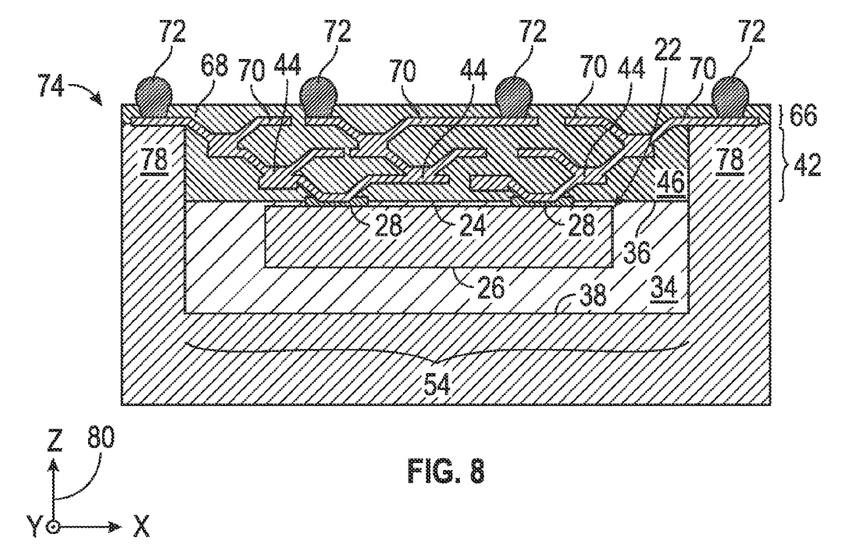

With reference to FIGS. 7 and 8, molded RCP panel 58 may next be inverted and attached to a ceramic carrier 64 or other such platform for the build-up of one or more topside RDL layers 66. Topside RDL layers 66 may include a dielectric body 68 and interconnect lines 70, which may be produced in essentially the same manner as were dielectric body 46 and interconnect lines 44, respectively, contained within core RDL layers 42 and described above in conjunction with FIG. 4. An uppermost dielectric, capping, or passivation layer may also be formed over topside RDL layers 66. The passivation layer and/or the uppermost RDL layer 66 may then be lithographically patterned to form openings or trenches in topside RDL layers 66 exposing interconnect lines 70, an electrically-conductive material may be deposited into the openings, and the contact array may then be deposited. As shown in FIG. 8, the contact array formed over the RCP package topside may be a Ball Grid Array (BGA) 72 including a plurality of solder balls; however, in other embodiments, the contact array may assume other forms, such as externally-exposed bond pads in ohmic contact with the interconnect lines formed within the RDL layer, bodies of a conductive-paste in ohmic contact with the RDL interconnect lines, or exposed portions of the RDL interconnect lines. Interconnect lines 70 in topside RDL layers 66 and interconnect lines 44 in core RDL layers 42 cooperate to electrically couple bond pads 28 of embedded semiconductor die 22 to the BGA solder balls 72. RCP panel 58 (identified in FIG. 7) may then be singulated using, for example, a dicing saw to produce a plurality of RCP packages 74, which are each encapsulated within an outer molded body 76, as shown in FIG. 8. Alternatively, RCP panel 58 can be divided into fewer portions and neighboring core packages embedded within the RCP panel can be interconnected by way of the routing within topside RDL layers 66. As a still further alternative, RCP panel 58 may not undergo singulation and may itself serve as the final package, while some or all of the core packages embedded within RCP panel may be interconnected by way of topside RDL layers 66.

As do RCP packages generally, the final RCP package shown in FIG. 8 includes an enlarged surface area as compared to embedded die 20 over which a relatively large contact formation (e.g., BGA 72) can be formed. However, in contrast to conventional RCP packages, the final RCP package shown in FIG. 8 includes one or more core RDL layers 42, which have been tested along with die 20 to ensure proper functioning prior to the final encapsulation. Additionally, as indicated in FIG. 8, core RDL layers 42 are circumscribed or surrounded by a portion of outer molded body 76 (in this case, a fan-out region or peripheral sidewall portion 78 included within outer molded body 76). This affords additional mechanical protection not only to semiconductor die 20, but also to core RDL layers 42, which may be primarily composed of a relatively brittle dielectric material. Topside RDL layers 66 extend over peripheral sidewall portion 78 of molded body 76. As a result of this structural configuration, RDL layers 42 and 66 have a stepped geometry at their interface as topside RDL layers 66 extend outwardly beyond RDL layers 42 along a plane containing the upper principal surface of core RDL layers 42; that is, in the X and Y directions identified by coordinate legend 80 in FIG. 8. By virtue of this design, the I/O pin count of the final RCP package 74 (and the other RCP packages produced pursuant to the above-described packaging method) is increased and superior structural protection is provided to core RDL layers 42 and embedded die 20. Additionally, exceptionally high panel yields can be achieved as only known-good core packages are included within the RCP panel (i.e., panel 58 identified in FIG. 7) produced pursuant to encapsulation.

In the foregoing example, and referring briefly once again to FIG. 4, core RCP packages 52 and 54 were separated during singulation of RCP panel 34 and single core packages (e.g., core RCP package 52 shown in FIGS. 5-8) were then utilized in the latter packaging stages (e.g., final encapsulation, build-up of the outer RDL layers, and bumping) to produce the final RCP package shown in FIG. 8. However, the core packages need not be divided into single units during singulation of RCP panel 34 and may instead be divided into sets, such as 2×1 arrays, 2×2 arrays, 2×3 arrays, 3×3 arrays, and so on, for inclusion in the final RCP package. This may be more fully appreciated by referring to FIG. 9, which illustrates an embodiment wherein RCP panel 34 (identified in FIGS. 2-4) has been singulated into dual device core RCP package 82, which includes a molded body 84 containing both semiconductor die 20 and 22. In this case, semiconductor die 20 and 22 may or may not be interconnected by the routing within core RDL layers 42. Dual device core RCP package 82 may be processed in essentially the same manner described above. Specifically, referring to FIGS. 9-11 wherein like reference numerals are utilized to denote like structural elements, core package 82 may be inverted and attached to a temporary substrate 56 (FIG. 9); encapsulated within a molded RCP panel 58 (FIG. 10); and released from the temporary substrate 56, attached to a carrier 64, and processed to build-up topside RDL layers 66 over RCP panel 58 and semiconductor die 20 and 22 contained therein (FIG. 11). A BGA 72 or other contact array may then be formed over the topside RDL layers 66 and in ohmic contact with interconnect lines 70 contained therein. The RCP panel 58 (identified in FIG. 10) may be singulated into a number of discrete molded bodies, including a molded body 58 containing semiconductor die 20 and 22. As indicated in FIG. 11, the final RCP package 82 may include an enlarged surface area supportive of BGA 72, stepped RDL layers 42 and 66, and a molded body 76 having a peripheral sidewall region 78 surrounding core RDL layers 42 and overlaid by topside RDL layers 66.

Figure 12:
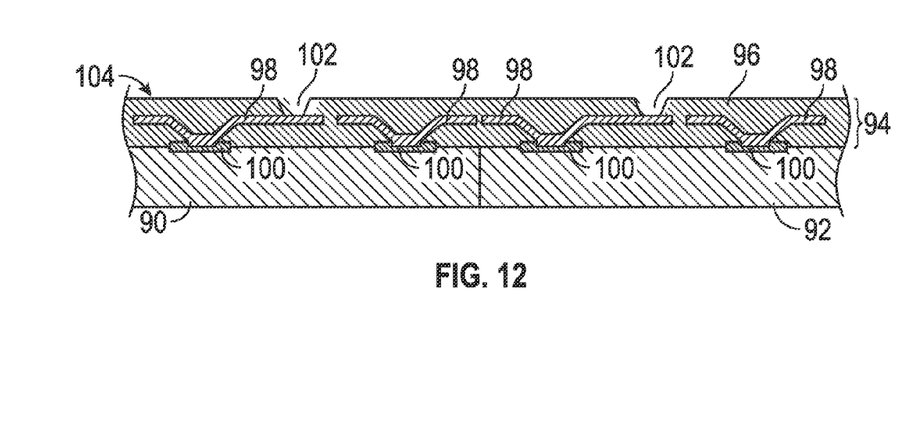
FIGS. 12-14 illustrate one manner in which semiconductor die having one or more core RDL layers formed thereover and initially produced utilizing a modified Chip Scale Packaging (CSP) process can be incorporated into a final RCP package including one or more topside RDL layers, as illustrated in accordance with a further exemplary embodiment of the present invention.
Figure 13:
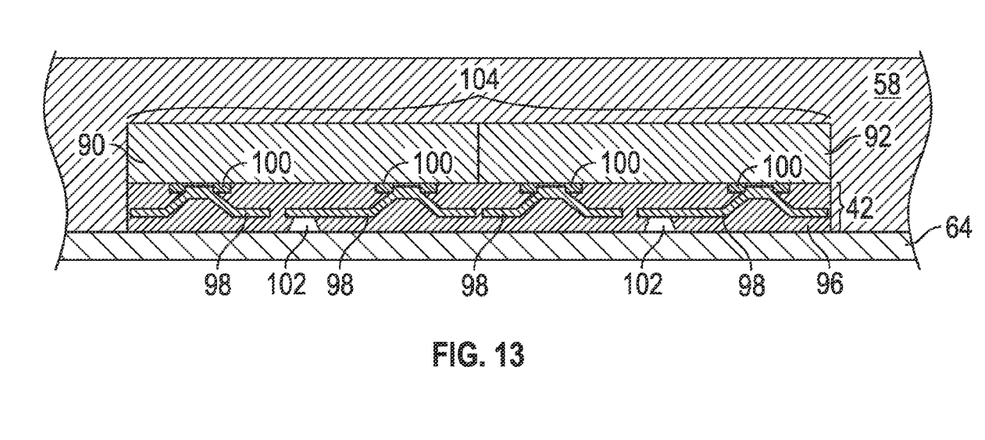
Figure 14:
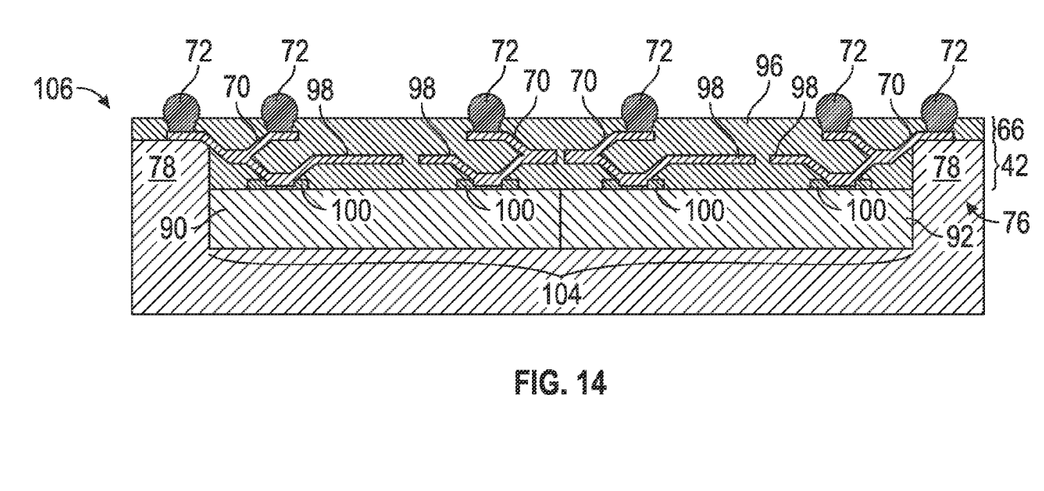

Exemplary embodiments of a packaging process have now been described wherein an RCP-type packaging approach was utilized to build-up one or more core RDL layers over semiconductor die, which were then integrated into a larger RCP package. The foregoing example notwithstanding, any process suitable for producing one or more core RDL layers over one or more semiconductor die or other microelectronic components can be employed in alternative embodiments of the packaging process. For example, in further embodiments, a CSP-type packaging process can be utilized to form one or more core RDL layers over an array of semiconductor die, while the die remain conjoined in wafer form. After formation of the RDL layers, the wafer may be singulated to into singular, discrete die or sets of conjoined die (e.g., 1×2, 2×2, 2×3, or 3×3 arrays, etc.) overlaid by the core RDL layers. Furthermore emphasizing this point, FIGS. 12-14 illustrate an integrally-formed or non-singulated die array 90, 92 containing two die 90 and 92. Although produced from the same semiconductor wafer, die 90 and 92 may differ in structure and function; e.g., different regions of the wafer may be processed differently utilizing, for example, a pizza mask. Die array 90, 92 is shown after singulation form a larger wafer defining the opposing sidewalls of die 90 and 92. As can be seen in FIG. 12, specifically, a number of core RDL layers 94 have been formed over die 90 and 92. Core RDL layers 94 include a dielectric body 96 and a number of interconnect lines 98, which are formed within body 96 and in ohmic contact with bond pads 100 of die 90 and 92. As shown, trenches or openings 102 may be lithographically formed in the upper region of core RDL layers 94 to expose interconnect lines 98 at this juncture in the fabrication process; however, lithographical patterning can also be performed at a later juncture in further embodiments. Collectively, RDL layers 94 and die array 90, 92 form a partially-completed package referred to below as "core CSP package 104."

Core RDL layers 94, and the other core RDL layers described herein (e.g., core RDL layers 42 described above in conjunction with FIGS. 4-8), should be distinguished from the back-end interconnect layers produced during wafer-level processing of semiconductor die 90, 92 (or other such semiconductor die) to interconnect the transistors formed on die 90, 92 and thereby complete the integrated circuits carried thereby. As indicated in FIG. 12, core RDL layers 94 are formed over bond pads 100 and over the uppermost dielectric or passivation layer overlying die 90, 92 (not shown in FIG. 12 for clarity). In this regard, core RDL layers 94 may comprise those layers applied or otherwise formed over die 90, 92 subsequent to passivation and bond pad metallization. As a more specific and non-limiting example, core RDL layers 94 may be formed over a final passivation (e.g., glass) layer or a passivation stack (e.g., a combination of one or more alternating glass and polyimide layers) included within die 90, 92.

After testing die 90, die 92, and core RDL layers 94 for proper functioning, core CSP package 104 and the other non-illustrated core CSP packages may now be processed in the previously-described manner to yield number of multi-component RCP packages. With reference to FIG. 13, and again noting that like reference numerals have been used to denote like structural elements, core CSP package 104 may be inverted and attached to a temporary substrate 56. Core CSP package 104 is then overmolded or encapsulated within a molded RCP panel 58 (partially shown in FIG. 13) utilizing the above-described RCP panelization process. Afterwards, RCP panel 58 may be released from the temporary substrate 56, attached to a ceramic carrier or other platform, processed to build-up the topside RDL layers and the contact array thereover, and possibly singulated. The resultant structure is shown in FIG. 14. As shown in this figure, the final RCP package 106 includes a topside RDL layers 66, an overlying BGA 72, and an outer molded body 76 having a peripheral fan-out or sidewall region 78 surrounding core RDL layers 42. Again, topside RDL layers 66 extend over the uppermost surface of sidewall region 78 and laterally beyond core RDL layers 94 such that RDL layers 66 and 94 have a stepped geometry at their juncture. Relative to other conventional CSP packages, the final RCP package 106 provides an increased surface area supportive of BGA 72 and an enhanced mechanical protection of die 90, die 92, and the overlying core RDL layers 94.

Figure 15:
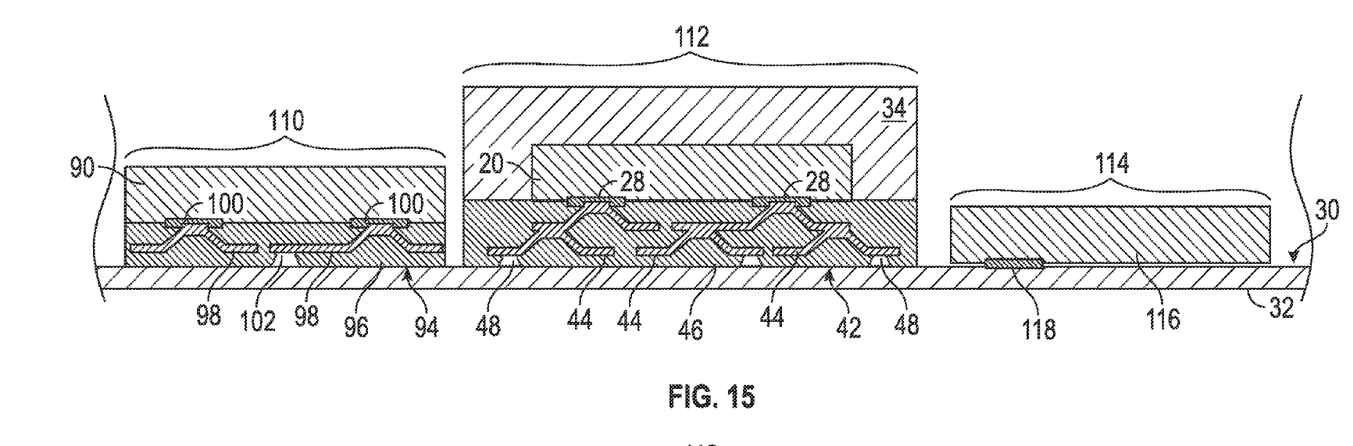
FIGS. 15-18 illustrate one manner in which different microelectronic components, which include at least one component having one or more core RDL layers formed thereover, can be integrated into a single package including one or more topside RDL layers such at least one of the components is positioned at an elevation or level overlapping with the core RDL layers, as illustrated in accordance with a still further embodiment of the present invention.

FIGS. 15-18 illustrate an embodiment of the RCP packaging method useful in the production of microelectronic packages containing semiconductor die having core RDL layers formed thereover (whether utilizing a RCP-type packaging process, a CSP-type packaging process, or another process) in addition to other types of microelectronic components, such as additional semiconductor die lacking core RDL layers, leaded or non-leaded packages, and/or passive microelectronic devices, to list but a few examples. With reference to FIG. 15, there is shown three discrete structures or devices, which have been placed on a temporary substrate 56. By way of non-limiting example, the three discrete structures or devices may be: (i) a core CSP package 110, which may be produced in the manner described above in conjunction with FIG. 12; (ii) a core RCP package 112, which may be produced in the manner described above in conjunction with FIGS. 1-4; and (iii) an additional microelectronic component 114. As did core SCP package 104 described above in conjunction with FIGS. 12-14, core CSP package 110 includes a semiconductor die 90 over which a number of core RDL layers 94 has been formed (again noting that like reference numerals have been used to identify like structural elements). Similarly, as did core RCP package 52 described above in conjunction with FIGS. 5-8, core RCP package 112 includes a semiconductor die 22 over which one or more core RDL layers 42 has been produced. In this example, core RDL layers 42 of core RCP package 112 are produced to have a greater height or thickness (e.g., possibly due to the inclusion of a greater number of metal levels) than do core RDL layers 94 of CSP package 110; however, in other embodiments, core RDL layers 94 may be thicker than core RDL layers 42 or layers 94 and 42 may have a substantially equivalent thickness.

Additional microelectronic component 114 includes a component body 116 and a number of contacts 118 (one of which is shown in FIG. 15). In the exemplary embodiment, core RDL layers are not formed over microelectronic component 114; and component 114 is placed onto temporary substrate 56 such that contacts 118 directly seat on or are placed in intimate contact with the upper surface of substrate 56. Additional microelectronic component 114 can be a third semiconductor die over which core RDL layers have not been formed, in which case contacts 118 may assume the form of bond pads. Alternatively, microelectronic component 114 can be package, such as a leaded or no-lead package, in which case contacts 118 may assume the form of leads, a BGA, or another type of terminal or point-of-contact. In still further embodiments, microelectronic component 114 can be passive or discrete microelectronic device with which semiconductor die 90 of core CSP package 110 and/or semiconductor die 20 of core RCP package 112 may be interconnected through the subsequently-formed topside RDL layers to yield a SiP device.

Figure 16:
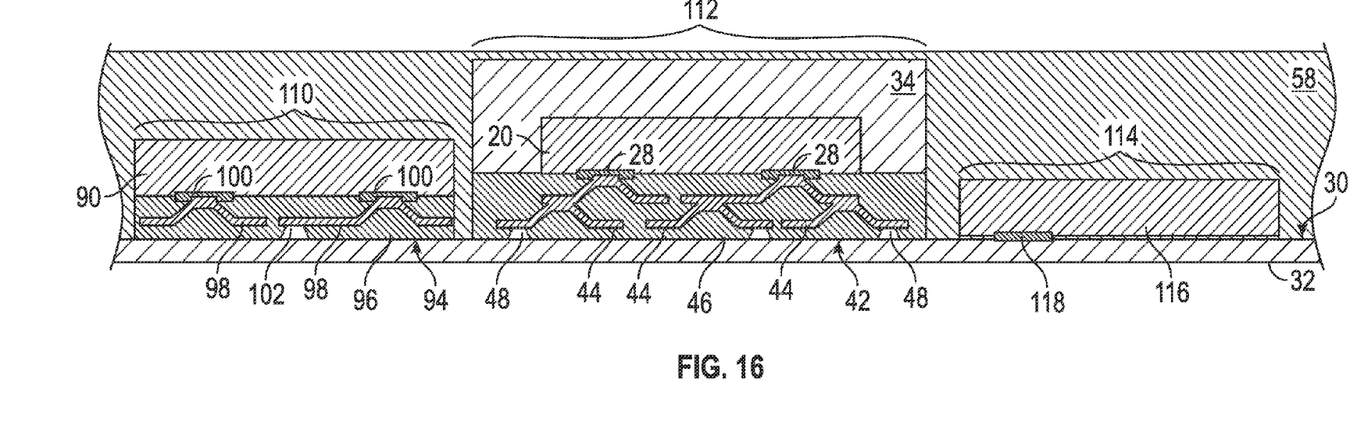
Figure 17:
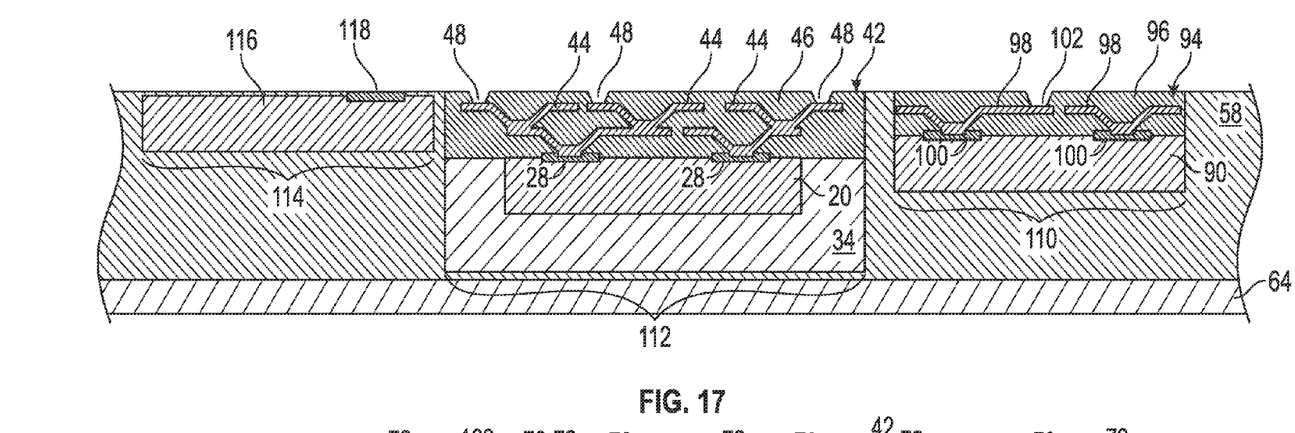
Figure 18:
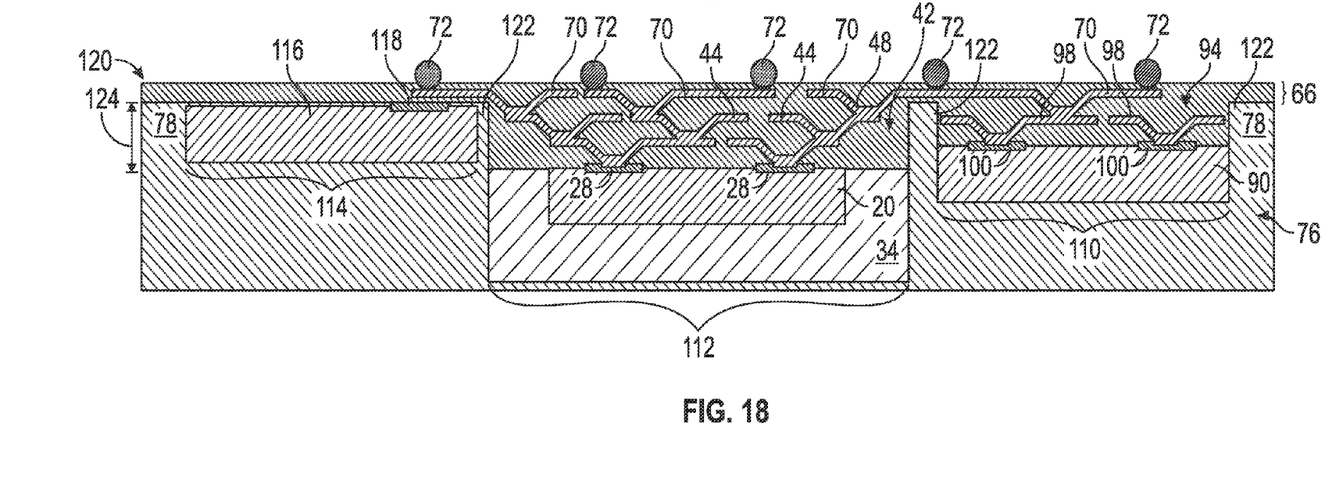

Processing of core CSP package 110, core RCP package 112, and microelectronic component 114 may be carried-out utilizing a method including steps similar or identical to those described above including, but not limited to, RCP encapsulation or panelization, topside RDL layers build-up, and external contact formation. FIG. 16 illustrates the partially-fabricated, multi-device RCP package after RCP panelization wherein like reference numerals have been utilized to denote like structural elements; and FIG. 17 illustrates the partially-fabricated RCP package after taped mold frame release, inversion, and carrier attachment. Finally, FIG. 18 illustrates the completed multi-device RCP package 120 after build-up of topside RDL layers 66, deposition of a capping or passivation layer, formation of a contact array (e.g., BGA 72), and singulation. As can be seen in FIG. 18, the final RCP package 120 includes a molded body 76 having a portions 122, which circumscribe or extend around core RDL layers 42 of core RCP package 112 and core RDL layers 94 of core CSP package 110. Furthermore, molded body 76 includes a peripheral fan-out or sidewall portion 78 over which topside RDL layers 66 extend. Furthermore, as indicated in FIG. 18 by double-headed arrow 124, microelectronic component 114 is disposed at the same level or elevation within RCP package 120 as are core RDL layers 42 of core RCP package 112 and partially overlaps in elevation with core RDL layers 94 of core CSP package 110. Similarly, semiconductor die 90 of core CSP package 110 overlaps partially in elevation (taken along a line substantially orthogonal to the frontside surface of package 120) with core RDL layers 42 of core RCP package 112. Stated differently, microelectronic component 114 and semiconductor die 90 each have a portion that is coplanar in elevation with core RDL layers 42 of core RCP package 112. Advantageously, embedding the microelectronic devices within the final RCP package at varying heights or elevation in this manner provides greater freedom in package layout and interconnect design.

The foregoing has thus provide embodiments of a packaging method enabling the integration of semiconductor die having one or more lower or core RDL layers into larger RCP packages having upper or topside RDL layers formed thereover. In so doing, embodiments of the above-described fabrication method surround the core RDL layers in an encapsulant to provide additional mechanical protection. Additionally, the above-described fabrication methods enable the testing of semiconductor die and the core RDL layers prior to final packaging to maximize product yield per fully-populated panel even when the final package is produced to include relatively complex metal routing. The foregoing packaging method is extremely flexible and can be utilized to package single semiconductor die, multiple interconnected semiconductor die, and one or more semiconductor die interconnected with various different types of microelectronic components. When utilized to package multiple microelectronic components, embodiments of the below-described packaging method allow the disposition of one or more of the encapsulated microelectronic component at a level or elevation overlapping with core RDL layers formed over one or more neighboring components.

In one embodiment, the above-described method includes the steps/processes of encapsulating a first semiconductor die having at least one core redistribution layer formed thereover in an outer molded body. The outer molded body has circumferential sidewall portion circumscribing (that is, extending around) the core redistribution layer. At least one topside redistribution layer is produced over the core redistribution layer. A contact array may then be formed over the topside redistribution layer. The contact array is electrically coupled to the first semiconductor die encapsulated in the outer molded body through the topside redistribution layers and the core redistribution layers.

In a further embodiment, the method includes the steps/processes of forming a RCP panel containing a first microelectronic component (e.g., a first semiconductor die), at least one core redistribution layer overlying and in ohmic contact with the first microelectronic component, and a second microelectronic component (e.g., a second semiconductor die, a leaded or no-lead package, or a passive microelectronic device) positioned proximate the first microelectronics component and at least partially overlapping in elevation with the core redistribution layer. At least one topside redistribution layer is produced over RCP panel interconnecting the first and second microelectronic component through the core redistribution layer. A BGA or other contact array is formed over the topside redistribution layer and electrically coupled to the first and second microelectronic components. In certain cases, the first microelectronic component comprises a first semiconductor die, and the method may further include: (i) overmolding a plurality semiconductor die including the first microelectronic device to produce a predecessor or initial RCP panel (e.g., RCP panel 34 shown in FIGS. 2-4); (ii) producing one or more core redistribution layers over the frontside of the initial RCP panel; and (iii) singulating the initial RCP panel to produce a core RCP package including an inner molded body surrounding the first semiconductor die. In such cases, the step or process of forming may comprise forming the RCP panel (e.g., RCP panel 58 shown in FIGS. 6 and 7) containing the core RCP package and microelectronic component.

The foregoing has also provided embodiments of a microelectronic package. In one embodiment, the microelectronic package includes a semiconductor die, at least one core redistribution layer formed over the semiconductor die, and an outer molded body in which the semiconductor die is embedded. The outer molded body has an outer peripheral portion extending around the core redistribution layer. At least one topside redistribution layer is formed over the core redistribution layer and the outer peripheral portion of the outer molded body. A contact array is further formed over the topside redistribution layer and electrically coupled to the semiconductor die embedded in the outer molded body through the core redistribution layer and the topside redistribution layer. In certain embodiments, the microelectronic package may also include an additional microelectronic component embedded within the outer molded body, overlapping in elevation with the core redistribution layer, and electrically interconnected with the semiconductor die.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for fabricating a microelectronic package, comprising:
encapsulating a first semiconductor die having one or more core redistribution layers formed thereover in an outer molded body, the outer molded body having a portion circumscribing the core redistribution layers;
producing one or more topside redistribution layers over the core redistribution layers; and
forming a contact array over the topside redistribution layers and electrically coupled to the first semiconductor die encapsulated in the outer molded body through the topside redistribution layers and the core redistribution layers;
wherein the first semiconductor die is embedded within an inner molded body, wherein encapsulating comprises forming an outer molded body around the inner molded body and the core redistribution layers, and wherein a second semiconductor die is embedded within the inner molded body and electrically interconnected with the first semiconductor die by the core redistribution layers.

2. The method of claim 1 wherein producing comprises producing one or more topside redistribution layers to extend at least partially over the portion of the outer molded body circumscribing the core redistribution layers.

3. The method of claim 1 wherein encapsulating comprises encapsulating a microelectronic component along with the first semiconductor die, and wherein producing comprises producing the one or more topside redistribution layers to electrically couple the microelectronic component through the one or more core redistribution layers.

4. The method of claim 1 further comprising testing the first semiconductor die and the one or more core redistribution layers prior to encapsulating the first semiconductor die in the outer molded body.

5. The method of claim 1 further comprising:
processing a wafer to produce an array of semiconductor die including the first semiconductor die and the second semiconductor die; and
producing one or more core redistribution layers over the frontside of the wafer prior to singulation thereof.

6. The method of claim 1 wherein encapsulating comprises:
positioning the first semiconductor die, the second semiconductor die, and a plurality of other semiconductor die on a temporary substrate;
dispensing a mold compound over the first semiconductor die, the second semiconductor die, and the plurality of other semiconductor die; and
curing the mold compound to form a molded panel containing the first semiconductor die, the second semiconductor die, and the plurality of other semiconductor die.

7. The method of claim 1 further comprising:
prior to encapsulating the first semiconductor die in the outer molded body, overmolding an array of semiconductor die including the first semiconductor die and the second semiconductor die to produce an initial Redistributed Chip Packaging (RCP) panel;
producing the one or more core redistribution layers over the frontside of the initial RCP panel; and
singulating the initial RCP panel to produce a core package including an inner molded body in which the first semiconductor die and the second semiconductor die are embedded.

8. The method of claim 7 wherein encapsulating comprises overmolding the core redistribution layers and the core package to form the outer molded body surrounding the inner molded body.

9. A method for fabricating a microelectronic package, comprising:
encapsulating a first semiconductor die having one or more core redistribution layers formed thereover in an outer molded body, the outer molded body having a portion circumscribing the core redistribution layers;
producing one or more topside redistribution layers over the core redistribution layers; and
forming a contact array over the topside redistribution layers and electrically coupled to the first semiconductor die encapsulated in the outer molded body through the topside redistribution layers and the core redistribution layers;
wherein encapsulating comprises encapsulating the first semiconductor die and a microelectronic component within the outer molded body, and wherein producing comprises producing one or more topside redistribution layers over the core redistribution layers and electrically interconnecting the first semiconductor die and the microelectronic component.

10. The method of claim 9 wherein the microelectronic component comprises a second semiconductor die over which one or more core redistribution layers have not been formed.

11. The method of claim 9 wherein the microelectronic component comprises a passive microelectronic device, and wherein the topside redistribution layers electrically interconnect the first semiconductor die and the passive microelectronic device to produce a System-in-Package.

12. The method of claim 9 wherein the microelectronic component is encapsulated within the outer molded body at an elevation overlapping with the core redistribution layers.

13. A method for fabricating a microelectronic package, comprising:
forming a Redistributed Chip Packaging (RCP) panel containing a first microelectronic component, one or more core redistribution layers overlying and in ohmic contact with the first microelectronic component, and a second microelectronic component positioned proximate the first microelectronic component and having a portion that is coplanar in elevation with the core redistribution layers;
producing one or more topside redistribution layers over the RCP panel interconnecting the first and second microelectronic component through the core redistribution layers; and forming a contact array over the topside redistribution layers and electrically coupled to the first and second microelectronic components.

14. The method of claim 13 wherein the first microelectronic component comprises a semiconductor die, and wherein the second microelectronic component comprises a passive microelectronic device.

15. The method of claim 13 further comprising singulating the RCP panel after forming the contact array to yield a plurality of RCP packages, one of which contains the first and second microelectronic components.

16. The method of claim 13 wherein the first microelectronic component comprises a first semiconductor die, and wherein the method further comprises:
processing a semiconductor wafer to produce an array of semiconductor die including the first semiconductor die; and
producing the core redistribution layers over the semiconductor wafer prior to singulation thereof.

17. The method of claim 13 wherein the first microelectronic component comprises a first semiconductor die, and wherein the method further comprises:
overmolding a plurality semiconductor die including the first microelectronic device to produce an initial RCP panel;
producing one or more core redistribution layers over the frontside of the initial RCP panel; and
singulating the initial RCP panel to produce a core RCP package including an inner molded body surrounding the first semiconductor die;
wherein forming comprises forming the RCP panel to contain the core RCP package and microelectronic component.

18. A microelectronic package, comprising:
a first semiconductor die;
one or more core redistribution layers formed over the first semiconductor die;
an outer molded body in which the first semiconductor die is embedded, the outer molded body having a portion extending around the core redistribution layers;
one or more topside redistribution layers formed over the core redistribution layers and the portion of the outer molded body extending around the core redistribution layers;
a microelectronic device embedded in the outer molded body and electrically coupled to the first semiconductor die through the core redistribution layers, through the topside redistribution layers, or a combination thereof; and
a contact array formed over the topside redistribution layers and electrically coupled to the first semiconductor die embedded in the outer molded body through the core redistribution layers and the topside redistribution layers.

19. The microelectronic package of claim 18 wherein the microelectronic device comprises a second semiconductor die electrically coupled to the contact array through the topside redistribution layers.

20. The microelectronic package of claim 18 wherein the microelectronic component is encapsulated within the outer molded body at an elevation overlapping with the core redistribution layers.

* * * * *